(12) United States Patent
Yao et al.

(10) Patent No.: US 11,367,811 B2
(45) Date of Patent: Jun. 21, 2022

(54) WHITE LIGHT EMITTING DIODE AND BACKLIGHT MODULE

(71) Applicant: APT ELECTRONICS CO. LTD., Guangdong (CN)

(72) Inventors: Shuguang Yao, Guangdong (CN);
Chuiming Wan, Guangdong (CN);
Xiaofeng Long, Guangdong (CN);
ChiWing Keung, Guangdong (CN);
Zhaoming Zeng, Guangdong (CN);
Guowei David Xiao, Guangdong (CN)

(73) Assignee: APT ELECTRONICS CO., LTD., Guangdong (CN)

( * ) Notice: Subject to any disclaimer, the term of this patent is extended or adjusted under 35 U.S.C. 154(b) by 72 days.

(21) Appl. No.: 16/884,087

(22) Filed: May 27, 2020

(65) Prior Publication Data

US 2020/0313048 A1 Oct. 1, 2020

Related U.S. Application Data

(63) Continuation of application No. PCT/CN2018/096081, filed on Jul. 18, 2018.

(30) Foreign Application Priority Data

Nov. 27, 2017 (CN) .......................... 201711204838.2

(51) Int. Cl.
*H01L 33/50* (2010.01)
*C09K 11/08* (2006.01)
(Continued)

(52) U.S. Cl.
CPC ........ *H01L 33/504* (2013.01); *C09K 11/0883* (2013.01); *H01L 25/0753* (2013.01); *H01L 33/62* (2013.01); *H01L 2224/48137* (2013.01)

(58) Field of Classification Search
CPC combination set(s) only.
See application file for complete search history.

(56) References Cited

U.S. PATENT DOCUMENTS

2007/0126011 A1 6/2007 Lee
2012/0037882 A1* 2/2012 Yoo .................... C09K 11/7734
257/13

(Continued)

FOREIGN PATENT DOCUMENTS

CN 1971908 A 5/2007
CN 203218260 U 9/2013

(Continued)

OTHER PUBLICATIONS

International Search Report issued by the State Intellectual Property Office of the P.R. China acting as the International Searching Authority in relation to International Application No. PCT/CN2018/096081 along with English Tanguage translation dated Sep. 18, 2018 (5 pages).

(Continued)

*Primary Examiner* — Ratisha Mehta
(74) *Attorney, Agent, or Firm* — Robert P. Michal, Esq.; Carter, DeLuca & Farrell LLP

(57) ABSTRACT

A white LED including red phosphor, at least one blue LED chip and at least one green LED chip, wherein a red light, a blue light and a green light are mixed simultaneously to produce a white light. The red phosphor comprises a first red phosphor and a second red phosphor. The first red phosphor is made from a substance having structure formula $M_2AX_6$:$Mn^{4+}$, wherein the element M is selected from Li, Na, K, Rb or Cs, the element A is selected from Ti, Si, Ge or Zr, and the element X is selected from F, Cl or Br; the ratio of the second red phosphor to the red phosphor ranges from 0.01% to 15%. Further provided is a backlight module. The adjustably colored points of a device comprising $M_2AX_6$:$Mn^{4+}$ are (Continued)

achieved by adding a second red phosphor to the red phosphor comprising $M_2AX_6:Mn^{4+}$.

17 Claims, 2 Drawing Sheets

(51) Int. Cl.
*H01L 25/075* (2006.01)
*H01L 33/62* (2010.01)

(56) References Cited

U.S. PATENT DOCUMENTS

2017/0145310 A1* 5/2017 Li .......................... C09K 11/02
2017/0309795 A1* 10/2017 Kim ...................... H01L 33/486
2017/0356624 A1* 12/2017 Petluri .................... F21V 5/04

FOREIGN PATENT DOCUMENTS

| CN | 105202483 A | 12/2015 |
| CN | 105428497 A | 3/2016 |
| CN | 107946434 A | 4/2018 |

OTHER PUBLICATIONS

Written Opinion of the International Searching Authority issued by the State Intellectual Property Office of the P.R. China acting as the International Searching Authority in relation to International Application No. PCT/CN2018/096081 dated Sep. 18, 2018 (4 pages).

* cited by examiner

WHITE LIGHT EMITTING DIODE AND BACKLIGHT MODULE

CROSS-REFERENCE TO RELATED APPLICATIONS

This application is a continuation of PCT International Patent Application No. PCT/CN2018/096081, filed Jul. 18, 2018, which claims the benefit of Chinese Application No. 201711204838.2 filed Nov. 27, 2017, the disclosure of each of these applications are expressly incorporated herein by reference in their entireties.

TECHNICAL FIELD

The following relates to the field of diode, in particular to a white light emitting diode (LED) and backlight module.

BACKGROUND OF INVENTION

Wide color gamut has become a newly focused hot issue in the field of backlight, and there is rising commercial demand in color gamut for higher quality. As the full width at half maxima (FWHM) of conventional nitride red phosphor is relatively wide, the NTSC color gamut is normally limited to around 90%, which is hardly improved further.

Novel phosphor having a structure of $M_2AX_6$, activated by $Mn^{4+}$, has a narrow FWHM of less than 10 nm and high color purity, and the NTSC color gamut of this novel phosphor can reach to over 98%, which is greatly improved comparing with the conventional phosphors, it therefore becomes a hot spot in recent research.

In a backlight module, different screens have different color filter (CF), leading to various changes of the colored points after the light, emitted from LED, passing through the screens. Because the emission wavelength and spectral shape of this novel phosphor cannot be adjusted, the "color" of those colored points are not freely adjustable, the specific "color" of some colored points may not be enabled, resulting in unqualified color temperature and deep-ultraviolet (DUV) energy parameter after the light, emitted from LED, passing through the screen in the backlight module. It is desired to achieve the adjustably colored points based on a novel phosphor having a structure of $M_2AX_6$ activated by $Mn^+$.

SUMMARY OF THE INVENTION

It is an objective of the invention to provide a white LED to enable colored points of novel phosphor having a structure of $M_2AX_6$, activated by $Mn^{4+}$ to be adjustable.

It is also an objective of the invention to provide a backlight module.

The objective is achieved by the following technical solutions: A white LED comprising red phosphor, at least one blue LED chip and at least one green LED chip, wherein a red light, a blue light and a green light are mixed simultaneously to produce a white light.

The red phosphor comprises a first red phosphor and a second red phosphor.

The first red phosphor is made from a substance having structure formula $M_2AX_6:Mn^{4+}$, wherein the element M is selected from Li, Na, K, Rb, or Cs; the element A is selected from Ti, Si, Ge, or Zr; the element X is selected from F, Cl, or Br; the ratio of the second red phosphor to the red phosphor ranges from 0.01% to 15%.

The blue light is emitted by the blue LED chip, the green light is emitted by the green LED chip, and the red light is emitted by the red phosphor which absorbed the blue light or the green light.

Preferably, the second red phosphor has an emission wavelength ranging from 630 nm to 670 nm.

Preferably, the blue LED chip has an emission wavelength ranging from 430 nm to 460 nm, and the green LED chip has an emission wavelength ranging from 510 nm to 550 nm.

Preferably, the second red phosphor is selected from the followings:

the second red phosphor having an emission wavelength of 630 nm, and a FWHM being no greater than 35 nm; or the second red phosphor having an emission wavelength that is larger than 630 nm and less than or equal to 635 nm, and a FWHM being no greater than 40 nm; or the second red phosphor having an emission wavelength that is larger than 635 nm and less than or equal to 640 nm, and a FWHM being no greater than 50 nm or the second red phosphor having an emission wavelength that is larger than 640 nm and less than or equal to 645 nm, and a FWHM being no greater than 60 nm; or the second red phosphor having an emission wavelength that is larger than 645 nm and less than or equal to 650 nm, and a FWHM being no greater than 70 nm; or the second red phosphor having an emission wavelength that is larger than 650 nm and less than or equal to 655 nm, and a FWHM being no greater than 90 nm; or the second red phosphor having an emission wavelength that is larger than 655 nm and less than or equal to 660 nm, and a FWHM being no greater than 100 nm; or the second red phosphor having an emission wavelength that is larger than 660 nm and less than or equal to 665 nm, and a FWHM being no greater than 105 nm; or the second red phosphor having an emission wavelength that is larger than 665 nm and less than 670 nm, and a FWHM being no greater than 110 nm; or the second red phosphor having an emission wavelength of 670 nm, and a FWHM being no greater than 110 nm.

Preferably, with the addition of the second red phosphor, an increasing light emission intensity from the red phosphor, compared with an light emission intensity from the first red phosphor before the second red phosphor added, at the emission wavelength ranging from 600 nm to 630 nm will be less than or equal to an increasing light emission intensity from the red phosphor, compared with an light emission intensity from the first red phosphor before the second red phosphor added, at the emission wavelength ranging from 630 nm to 670 nm.

Preferably, the second red phosphor comprises one or more compound selected from $CaAlSiN_3:Eu$, $SrLiAl_3N_4:Eu$, or Quantum Dot (QD).

Preferably, the second red phosphor has an emission wavelength ranging from 630 nm to 670 nm, and a FWHM ranging from 35 nm to 110 nm.

Preferably, the white LED further comprises a leadframe, a thermoplastic or thermosetting transparent protective layer, and a fluorescence conversion layer provided on the leadframe; the blue LED chip and the green LED chip are arranged on the leadframe and are covered by the fluorescence conversion layer; the red phosphor is dispersed in the fluorescence conversion layer which is wrapped up by the thermoplastic or thermosetting transparent protective layer wherein the blue light, the green light and the red light are distributed.

The present invention further provides a backlight module comprising above-described white LED.

Preferably, the backlight module further comprises a plurality of lenses, a backing plate, a lower diffusion sheet, an upper diffusion sheet, a prism sheet and a PCB, wherein a plurality of white LEDs are arranged on the PCB, and each of the lenses is arranged on each of the white LEDs; the PCB is surrounded by the backing plate at the PCB's periphery, and the lower diffusion sheet, the prism sheet and the upper diffusion sheet are arranged above the backing plate from bottom to top.

Alternatively, the backlight module further comprises a light guiding module which includes a light guide plate, a brightness enhancement film arranged on the upper surface of the light guide plate, a diffuser film and a reflective sheet underneath the light guide plate, wherein a plurality of the white LEDs are arranged on a PCB and configured adjacent to the light guiding module.

The present invention has following benefits as compared with the prior art:

As the emission wavelength and spectrum of the phosphor comprising $M_2AX_6:Mn^{4+}$ are barely changed, resulting in an invariant spectral shape of the LED and non-adjustably colored points, a second red phosphor having various wavelength, whose emission wavelength and spectral shape can be adjusted, is added into the phosphor comprising $M_2AX_6$: $Mn^{4+}$, so that the mixture of the phosphor will have an adjustable spectrum, thereby the colored points of the device comprising $M_2AX_6:Mn^{4+}$ are adjustable. The device can enable full range of colored points with hardly any reduction in the NTSC color gamut.

Figure 1:
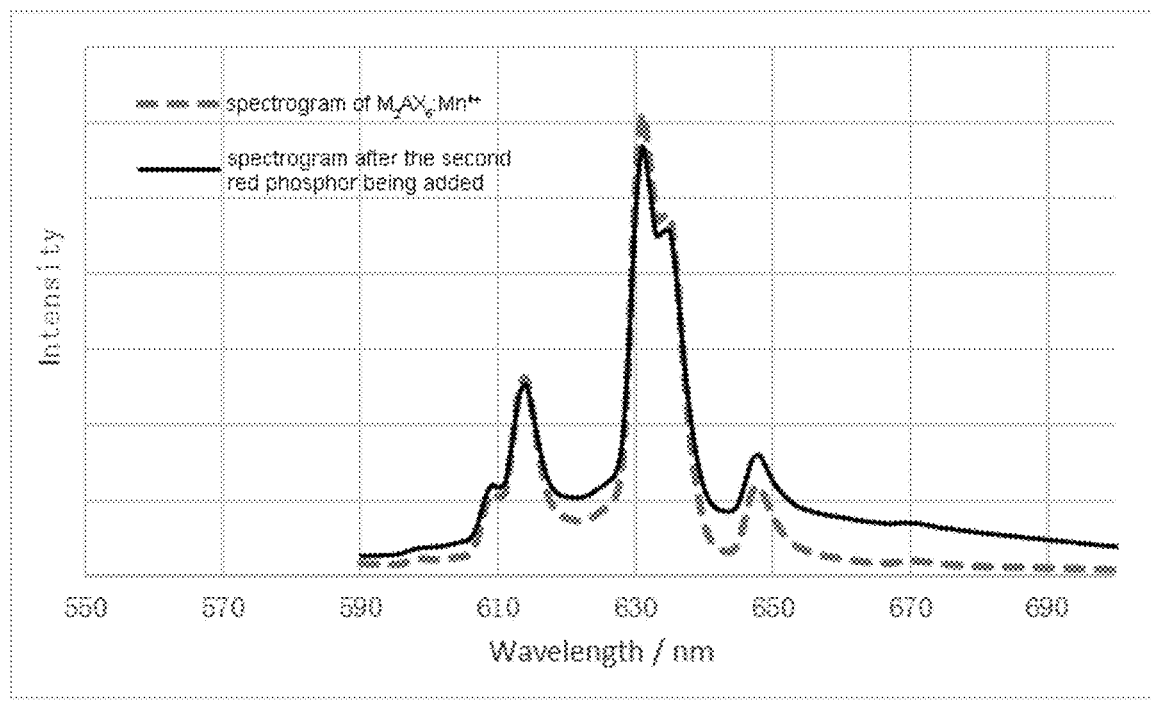
FIG. 1 is a typical spectrogram of $M_2AX_6:Mn^{4+}$ and the red phosphor according to embodiments of present invention.

| List of reference characters | |
|---|---|
| 100 | White LED |
| 101 | Leadframe |
| 102 | Chip |
| 103 | Fluorescence Conversion Layer |
| 201 | Lens |
| 202 | PCB |
| 203 | Backing Plate |
| 204 | Lower Diffusion Sheet |
| 205 | Prism Sheet |
| 206 | Upper Diffusion Sheet |
| 301 | PCB |
| 302 | Reflective Sheet |
| 303 | Light Guide Plate |
| 304 | Brightness Enhancement Film |
| 305 | Diffuser Film |

DETAILED DESCRIPTION OF THE INVENTION

The invention will be described in more details hereinafter with reference to the figures and embodiments.

The present invention provides a white LED comprising red phosphor, at least one blue LED chip and at least one green LED chip, whereby a white light is produced by mixing red light, blue light and green light together.

The red phosphor comprises a first red phosphor and a second red phosphor.

The first red phosphor is made from a substance having structure formula $M_2AX_6:Mn^{4+}$, wherein
the element M is selected from Li, Na, K, Rb or Cs;
the element A is selected from Ti, Si, Ge or Zr; and
the element X is selected from F, Cl or Br.

The second red phosphor comprises one or more compound selected from $CaAlSiN_3$:Eu, $SrLiAl_3N_4$:Eu, or QD. The ratio of the second red phosphor to the red phosphor ranges from 0.01% to 15%. The second red phosphor has an emission wavelength ranging from 630 nm to 670 nm and a FWHM ranging from 35 nm to 110 nm. The red light is emitted by the red phosphor which absorbed blue light or green light.

To improve the color purity of the red phosphor and the NTSC color gamut, the second red phosphor is added into the first red phosphor to form the red phosphor, whereby the increasing light emission intensity from the red phosphor, compared with the light emission intensity from the first red phosphor before the second red phosphor added, at the emission wavelength ranging from 600 nm to 630 nm will be less than or equal to the increasing light emission intensity from the red phosphor, compared with the light emission intensity from the first red phosphor before the second red phosphor added, at the emission wavelength ranging from 630 nm to 670 nm, as shown in FIG. 1. In practice, the first red phosphor constitutes the main part of the red phosphor, and the second red phosphor having the variable emission wavelength is added therein for the sake of adjusting the colored points (because the colored points are non-adjustable if there are only the first phosphor due to the invariant spectrum of the first phosphor no matter it comprises Si, Ge, or Ti), where the second red phosphor is selected to have a special emission wavelength and FWHM, such that the increasing light emission intensity from the red phosphor, compared with the light emission intensity from the first red phosphor before the second red phosphor added, at the emission wavelength ranging from 600 nm to 630 nm will be less than or equal to the increasing light emission intensity from the red phosphor, compared with the light emission intensity from the first red phosphor before the second red phosphor added, at the emission wavelength ranging from 630 nm to 670 nm. For example, when the second red phosphor is selected to have an emission wavelength of 630 nm and a FWHM of 30 nm, the foresaid increasing light emission intensity at the emission wavelength of 614 nm is equal to the increasing light emission intensity at the emission wavelength of 647 nm; when the second red phosphor is selected to have an emission wavelength of 650 nm and a FWHM of 70 nm, the foresaid increasing light emission intensity at the emission wavelength of 614 nm is less than the increasing light emission intensity at the emission wavelength of 647 nm.

Preferably, the second red phosphor is selected from the followings:
the second red phosphor having an emission wavelength of 630 nm, and a FWHM being no greater than 35 nm; or
the second red phosphor having an emission wavelength that is larger than 630 nm and less than or equal to 635 nm, and a FWHM being no greater than 40 nm; or the second red phosphor having an emission wavelength that is larger than 635 nm and less than or equal to 640 nm, and a FWHM being no greater than 50 nm; or the second red phosphor having an emission wavelength that is larger than 640 nm and less than or equal to 645 nm, and a FWHM being no greater than 60 nm; or the second red phosphor having an emission wavelength that is larger than 645 nm and less than or equal to 650 nm, and a FWHM being no greater than 70 nm; or the second red phosphor having an emission wavelength that is larger than 650 nm and less than or equal to 655 nm, and a FWHM being no greater than 90 nm; or the second red phosphor having an emission wavelength that is larger than 655 nm and less than or equal to 660 nm, and a FWHM being no greater than 100 nm; or the second red phosphor having an emission wavelength that is larger than 660 nm and less than or equal to 665 nm, and a FWHM being no greater than 105 nm; or the second red phosphor having an emission wavelength that is larger than 665 nm and less than 670 nm, and a FWHM being no greater than 110 nm; or the second red phosphor having an emission wavelength of 670 nm, and a FWHM being no greater than 110 nm.

The appropriate second red phosphor is selected from those having the emission wavelength and FWHM as described above, in order to improve the color purity of the red phosphor mixed and improve the NTSC color gamut.

The blue LED chip has an emission wavelength ranging from 430 nm to 460 nm and the green LED chip has an emission wavelength ranging from 510 nm to 550 nm.

Figure 2:
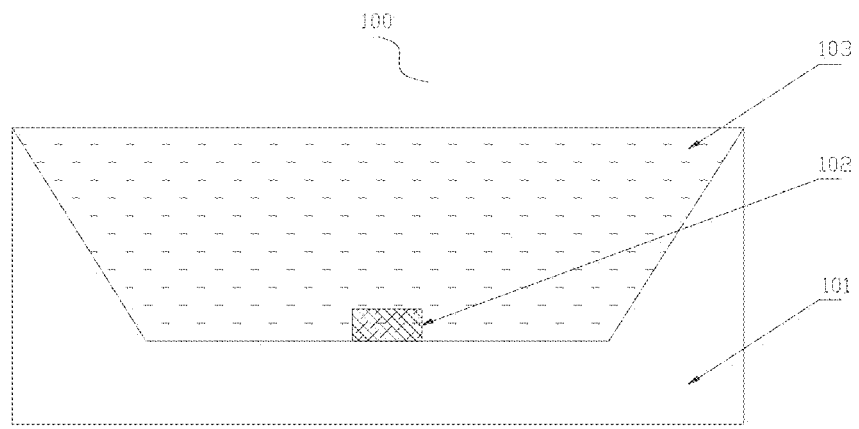
FIG. 2 is a structure schematic view of a white LED according to the embodiments of the present invention.

As shown in FIG. 2, the physical structure of the white LED further comprises a leadframe 101, a thermoplastic or thermosetting transparent protective layer, and a fluorescence conversion layer 103 provided on the leadframe 101; the blue LED chip and the green LED chip are arranged on the leadframe and are covered by the fluorescence conversion layer 103; the red phosphor is dispersed in the fluorescence conversion layer 103 which is wrapped up by the thermoplastic or thermosetting transparent protective layer wherein the blue light, the green light and the red light are distributed.

Embodiment 1

This embodiment provides a white LED whose white light is produced by mixing blue light, green light and red light together.

The red light is emitted by the red phosphor which absorbed blue light or green light. The blue light having a wavelength of 450 nm is emitted by the blue LED chip. The green light having a wavelength of 520 nm is emitted by the green LED chip.

The red phosphor comprises a first red phosphor and a second red phosphor, wherein the first red phosphor is made from a substance having structure formula $K_2SiF_6:Mn^{4+}$, and the second red phosphor is made from a substance having structure formula $SrLiAl_3N_4$:Eu whose light emission wavelength is 650 nm and FWHM is 45 nm; wherein the ratio of the second red phosphor to the red phosphor is 5%. With the addition of the second red phosphor to the first red phosphor, the increasing light emission intensity from the red phosphor, compared with the light emission intensity from the first red phosphor before the second red phosphor added, at the emission wavelength ranging from 600 nm to 630 nm will be less than or equal to the increasing light emission intensity from the red phosphor, compared with the light emission intensity from the first red phosphor before the second red phosphor added, at the emission wavelength ranging from 630 nm to 670 nm.

The blue light, the green light and the red light are distributed in the thermoplastic or thermosetting transparent protective layer; the NTSC color gamut of the LED according to this embodiment is reduced by no more than 1% on the basis of the NTSC color gamut of pure $K_2SiF_6:Mn^{4+}$.

Embodiment 2

This embodiment provides a white LED which is extremely similar to the one in the embodiment 1, except the following differences, while their identical parts will not be repeated here.

The blue LED chip has an emission wavelength of 445 nm and the green LED chip has an emission wavelength of 525 nm.

The red phosphor comprises a first red phosphor and a second red phosphor; wherein the first red phosphor is made from a substance having structure formula $K_2TiF_6:Mn^{4+}$, and the second red phosphor is made from a substance having structure formula $CaAlSiN_3$:Eu whose light emission wavelength is 670 nm and FWHM is 90 nm; wherein the ratio of the second red phosphor to the red phosphor is 10%.

The NTSC color gamut of the LED according to this embodiment is reduced by 3% on the basis of the NTSC color gamut of pure $K_2TiF_6:Mn^{4+}$.

Embodiment 3

This embodiment provides a white LED which is extremely similar to the one in the embodiment 1, except the following differences, while their identical parts will not be repeated here.

The first red phosphor is made from a substance having structure formula $K_2GeF_6:Mn^{4+}$, and the second red phosphor is made from QD and $SrLiAl_3N_4$:Eu whose light emission wavelength is 640 nm and FWHM is 30 nm; wherein the ratio of the second red phosphor to the red phosphor mixed is 8%.

The NTSC color gamut of the LED according to this embodiment is reduced by 1%-2% on the basis of the NTSC color gamut of pure $K_2GeF_6:Mn^{4+}$.

Embodiment 4

This embodiment provides a white LED which is extremely similar to the one in the embodiment 1, except the following differences, while their identical parts will not be repeated here.

The first red phosphor is made from a substance having structure formula $K_2GeF_6:Mn^{4+}$, and the second red phosphor is made from QD and $SrLiAl_3N_4$:Eu whose light emission wavelength is 645 nm and FWHM is 50 nm; wherein the ratio of the second red phosphor to the red phosphor mixed is 0.05%.

The NTSC color gamut of the LED according to this embodiment is reduced by 1%-2% on the basis of the NTSC color gamut of pure $K_2GeF_6:Mn^{4+}$.

This embodiment further provides a backlight module, including direct-lit backlight module and edge-lit backlight module.

Embodiment 5

This embodiment uses an existing LED direct-lit backlight module, wherein the LEDs are in accordance with the present invention.

Figure 3:
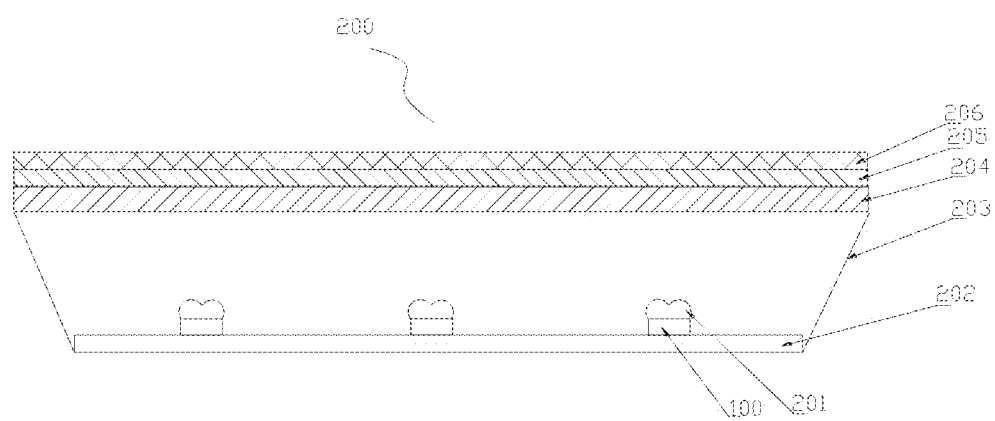
FIG. 3 is a schematic view of direct-lit module with high color gamut according to the embodiment 5 of the present invention.

As shown in FIG. 3, the LED direct-lit backlight module comprises a PCB 202, a plurality of optical lenses 201, a lower diffusion sheet 204, a prism sheet 205, an upper diffusion sheet 206, and a backing plate 203. A plurality of LED devices 100 are arranged on the PCB 202, and each of the lenses 201 is arranged on each of the LED devices 100; such PCB 202 is fixed up to the bottom of the backing plate 203, and the lower diffusion sheet 204 is arranged on the top of the backing plate 203; the prism sheet 205 is arranged on the lower diffusion sheet 204 and the upper diffuser sheet 206 is arranged on the prism sheet 205.

Embodiment 6

This embodiment uses an existing LED edge-lit backlight module, wherein the LEDs are in accordance with the present invention.

Figure 4:
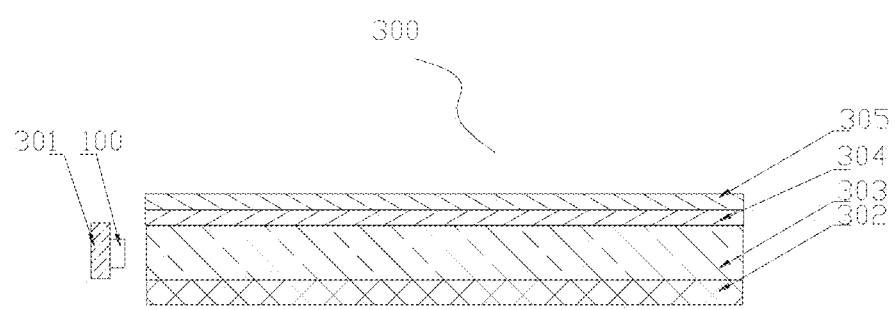
FIG. 4 is a schematic view of edge-lit module with high color gamut according to the embodiment 6 of the present invention.

As shown in FIG. 4, the LED edge-lit backlight module comprises a light guide plate 303, a reflective sheet 302, a brightness enhancement film 304, and a diffuser film 305. A LED device 100 is secured to a PCB 301 to form an integration which is arranged adjacent to the light guide plate 303. The reflective sheet 302 is arranged underneath the light guide plate 303, and the brightness enhancement film 304 is arranged on the upper surface of the light guide plate 303, and the diffuser film 305 is arranged on the brightness enhancement film 304.

The embodiment described hereinbefore is merely preferred embodiment of the present invention and not for purposes of any restrictions or limitations on the invention. It will be apparent that any non-substantive, obvious alterations or improvement by the technician of this technical field according to the present invention may be incorporated into ambit of claims of the present invention.

For the sake of clarity, it is to be understood that the use of 'a' or 'an' throughout this application does not exclude a plurality, and 'comprise' or 'comprising' do not exclude other steps or elements.

What is claimed is:

1. A white LED, comprising red phosphor, at least one blue LED chip and at least one green LED chip, wherein a red light, a blue light and a green light are mixed simultaneously to produce a white light; the blue light is emitted by the blue LED chip, the green light is emitted by the green LED chip, and the red light is emitted by the red phosphor which absorbed the blue light or the green light; wherein
the red phosphor comprises a first red phosphor and a second red phosphor;
the first red phosphor is made from a substance having structure formula $M_2AX_6:Mn^{4+}$, wherein
the element M is selected from Li, Na, K, Rb or Cs;
the element A is selected from Ti, Si, Ge or Zr; and
the element X is selected from F, Cl or Br;
the ratio of the second red phosphor to the red phosphor ranges from 0.01% to 15%.

2. The white LED of claim 1, wherein the second red phosphor has an emission wavelength ranging from 630 nm to 670 nm.

3. The white LED of claim 1, wherein the blue LED chip has an emission wavelength ranging from 430 nm to 460 nm, and the green LED chip has an emission wavelength ranging from 510 nm to 550 nm.

4. The white LED of claim 2, wherein
the second red phosphor is selected from the followings:
the second red phosphor having an emission wavelength of 630 nm, and a FWHM being no greater than 35 nm; or
the second red phosphor having an emission wavelength that is larger than 630 nm and less than or equal to 635 nm, and a FWHM being no greater than 40 nm; or
the second red phosphor having an emission wavelength that is larger than 635 nm and less than or equal to 640 nm, and a FWHM being no greater than 50 nm; or
the second red phosphor having an emission wavelength that is larger than 640 nm and less than or equal to 645 nm, and a FWHM being no greater than 60 nm; or
the second red phosphor having an emission wavelength that is larger than 645 nm and less than or equal to 650 nm, and a FWHM being no greater than 70 nm; or
the second red phosphor having an emission wavelength that is larger than 650 nm and less than or equal to 655 nm, and a FWHM being no greater than 90 nm; or
the second red phosphor having an emission wavelength that is larger than 655 nm and less than or equal to 660 nm, and a FWHM being no greater than 100 nm; or
the second red phosphor having an emission wavelength that is larger than 660 nm and less than or equal to 665 nm, and a FWHM being no greater than 105 nm; or
the second red phosphor having an emission wavelength that is larger than 665 nm and less than 670 nm, and a FWHM being no greater than 110 nm; or
the second red phosphor having an emission wavelength of 670 nm, and a FWHM being no greater than 110 nm.

5. The white LED of claim 2, wherein, with the addition of the second red phosphor to the first red phosphor, an increasing light emission intensity from the red phosphor, compared with an light emission intensity from the first red phosphor before the second red phosphor added, at the emission wavelength ranging from 600 nm to 630 nm will be less than or equal to an increasing light emission intensity from the red phosphor, compared with an light emission intensity from the first red phosphor before the second red phosphor added, at the emission wavelength ranging from 630 nm to 670 nm.

6. The white LED of claim 1, wherein the second red phosphor comprises one or more compound selected from $CaAlSiN_3:Eu$, $SrLiAl_3N_4:Eu$, or QD.

7. The white LED of claim 2, wherein the second red phosphor has an emission wavelength ranging from 630 nm to 670 nm, and a FWHM ranging from 35 nm to 110 nm.

8. The white LED of claim 1, further comprising a leadframe, a thermoplastic or thermosetting transparent protective layer, and a fluorescence conversion layer provided on the leadframe; the blue LED chip and the green LED chip are arranged on the leadframe and are covered by the fluorescence conversion layer; the red phosphor is dispersed in the fluorescence conversion layer which is wrapped up by the thermoplastic or thermosetting transparent protective layer wherein the blue light, the green light and the red light are distributed.

9. A backlight module comprising the white LED of claim 1.

10. The backlight module of claim 9, wherein the second red phosphor has an emission wavelength ranging from 630 nm to 670 nm.

11. The backlight module of claim 9, wherein the blue LED chip has an emission wavelength ranging from 430 nm to 460 nm, and the green LED chip has an emission wavelength ranging from 510 nm to 550 nm.

12. The backlight module of claim 10, wherein
the second red phosphor is selected from the followings:
the second red phosphor having an emission wavelength of 630 nm, and a FWHM being no greater than 35 nm; or the second red phosphor having an emission wavelength that is larger than 630 nm and less than or equal to 635 nm, and a FWHM being no greater than 40 nm; or the second red phosphor having an emission wavelength that is larger than 635 nm and less than or equal to 640 nm, and a FWHM being no greater than 50 nm; or the second red phosphor having an emission wavelength that is larger than 640 nm and less than or equal to 645 nm, and a FWHM being no greater than 60 nm; or the second red phosphor having an emission wavelength that is larger than 645 nm and less than or equal to 650 nm, and a FWHM being no greater than 70 nm; or the second red phosphor having an emission wavelength that is larger than 650 nm and less than or equal to 655 nm, and a FWHM being no greater than 90 nm; or the second red phosphor having an emission wavelength that is larger than 655 nm and less than or equal to 660 nm, and a FWHM being no greater than 100 nm; or the second red phosphor having an emission wavelength that is larger than 660 nm and less than or equal to 665 nm, and a FWHM being no greater than 105 nm; or the second red phosphor having an emission wavelength that is larger than 665 nm and less than 670 nm, and a FWHM being no greater than 110 nm; or the second red phosphor having an emission wavelength of 670 nm, and a FWHM being no greater than 110 nm.

13. The backlight module of claim 10, wherein, with the addition of the second red phosphor to the first red phosphor, an increasing light emission intensity from the red phosphor, compared with an light emission intensity from the first red phosphor before the second red phosphor added, at the emission wavelength ranging from 600 nm to 630 nm will be less than or equal to an increasing light emission intensity from the red phosphor, compared with an light emission intensity from the first red phosphor before the second red phosphor added, at the emission wavelength ranging from 630 nm to 670 nm.

14. The backlight module of claim 9, wherein the second red phosphor comprises one or more compound selected from CaAlSiN3:Eu, SrLiAl3N4:Eu, or QD.

15. The backlight module of claim 10, wherein the second red phosphor has an emission wavelength ranging from 630 nm to 670 nm, and a FWHM ranging from 35 nm to 110 nm.

16. The backlight module of claim 9, further comprising a leadframe, a thermoplastic or thermosetting transparent protective layer, and a fluorescence conversion layer provided on the leadframe; the blue LED chip and the green LED chip are arranged on the leadframe and are covered by the fluorescence conversion layer; the red phosphor is dispersed in the fluorescence conversion layer which is wrapped up by the thermoplastic or thermosetting transparent protective layer wherein the blue light, the green light and the red light are distributed.

17. The backlight module of claim 9, comprising a plurality of lenses, a backing plate, a lower diffusion sheet, an upper diffusion sheet, a prism sheet and a PCB, wherein a plurality of white LEDs are arranged on the PCB, and each of the lenses is arranged on each of the white LEDs; the PCB is surrounded by the backing plate at the PCB's periphery, and the lower diffusion sheet, the prism sheet and the upper diffusion sheet are arranged above the backing plate from bottom to top; or comprising a light guiding module which includes a light guide plate, a brightness enhancement film arranged on the upper surface of the light guide plate, a diffuser film and a reflective sheet underneath the light guide plate, wherein a plurality of the white LEDs are arranged on a PCB and configured adjacent to the light guiding module.

* * * * *